(12) United States Patent
Chen et al.

(10) Patent No.: US 11,967,363 B2
(45) Date of Patent: Apr. 23, 2024

(54) DISPLAY CONTROLLER HAVING A SURGE PROTECTION UNIT AND DISPLAY SYSTEM THEREOF

(71) Applicant: AP MEMORY TECHNOLOGY CORPORATION, Hsinchu County (TW)

(72) Inventors: Wenliang Chen, Hsinchu County (TW); Girish Nanjappa, Hsinchu County (TW); Lin Ma, Hsinchu County (TW); Hung-Piao Ma, Hsinchu County (TW); Keng Lone Wong, Hsinchu County (TW); Chun Yi Lin, Hsinchu County (TW)

(73) Assignee: AP MEMORY TECHNOLOGY CORPORATION, Hsinchu County (TW)

( * ) Notice: Subject to any disclaimer, the term of this patent is extended or adjusted under 35 U.S.C. 154(b) by 59 days.

(21) Appl. No.: 17/487,533

(22) Filed: Sep. 28, 2021

(65) Prior Publication Data
US 2022/0165205 A1    May 26, 2022

Related U.S. Application Data

(60) Provisional application No. 63/118,621, filed on Nov. 25, 2020.

(51) Int. Cl.
*G09G 3/20*     (2006.01)
*G09G 3/3208*   (2016.01)
(Continued)

(52) U.S. Cl.
CPC ........ *G11C 11/4093* (2013.01); *G09G 3/2096* (2013.01); *G09G 3/3208* (2013.01);
(Continued)

(58) Field of Classification Search
CPC ................................................... G09G 3/2096
See application file for complete search history.

(56) References Cited

U.S. PATENT DOCUMENTS

2006/0109392 A1\* 5/2006 Park ..................... G09G 3/3688
                                                          349/40
2007/0115248 A1\* 5/2007 Roberts .................. H05B 45/38
                                                          345/102
(Continued)

FOREIGN PATENT DOCUMENTS

CN    1779541 A     6/2020
CN    111357105 A   6/2020
(Continued)

OTHER PUBLICATIONS

English abstract translation of CN111357105A.
(Continued)

*Primary Examiner* — William Boddie
*Assistant Examiner* — Andrew B Schnirel
(74) *Attorney, Agent, or Firm* — WPAT, P.C.; Anthony King

(57) ABSTRACT

A display controller includes a first chip and a second chip. The first chip is configured to control a display device. The second chip is externally coupled to the first chip, and configured to be a random access memory and. The first chip is further configured to provide a first supply power to the second chip and to access the second chip during the controlling of the display device.

16 Claims, 5 Drawing Sheets

(51) Int. Cl.
  *G11C 11/4076* (2006.01)
  *G11C 11/4093* (2006.01)
  *G11C 11/419* (2006.01)
(52) U.S. Cl.
  CPC ........ *G11C 11/4076* (2013.01); *G11C 11/419* (2013.01); *G09G 2330/021* (2013.01); *G09G 2330/04* (2013.01)

(56) References Cited

U.S. PATENT DOCUMENTS

| | | | |
|---|---|---|---|
| 2013/0243137 A1 | 9/2013 | Pyeon | |
| 2013/0258220 A1* | 10/2013 | Uehara | G02F 1/13306 349/33 |
| 2014/0232691 A1* | 8/2014 | Lee | G06F 3/0443 345/174 |

FOREIGN PATENT DOCUMENTS

| | | |
|---|---|---|
| EP | 3699911 A1 | 8/2020 |
| TW | 201717349 A | 5/2017 |

OTHER PUBLICATIONS

English abstract translation of TW201717349A.
Office action and search report dated Nov. 21, 2022 for related Taiwan application TW110142068.
English abstract translation of the office action and search report dated Nov. 21, 2022 for related Taiwan application TW110142068.
Office action and search report dated Oct. 25, 2022 for corresponding Taiwan application TW110142908.
English abstract translation of the office action and search report dated Oct. 25, 2022 for corresponding Taiwan application TW110142908.
Office action and search report dated Sep. 25, 2023 for related China application 202111353969.3.
English abstract translation of the office action and search report dated Sep. 25, 2023 for related China application 202111353969.3.

* cited by examiner

DISPLAY CONTROLLER HAVING A SURGE PROTECTION UNIT AND DISPLAY SYSTEM THEREOF

CROSS REFERENCE

This application claims the benefit of prior-filed provisional application No. 63/118,621, filed on Nov. 25, 2020, which is incorporated by reference in its entirety.

TECHNICAL FIELD

The present disclosure relates to a display controller, and more particularly, to a display controller including an electrostatic discharge circuit.

DISCUSSION OF THE BACKGROUND

Generally, a display device may include a pixel array and a display driver circuit. The display driver can drive pixels in the pixel array to emit lights of different colors and/or different intensities according to image data so as to present a corresponding image. Since the display driver circuit and the pixel array are often formed beneath a cover glass of an end product, such as a mobile phone or a tablet, display devices are rather vulnerable to external electric fields.

For example, if an electrostatic discharge (ESD) event happens near a glass panel of a mobile phone, a surge may be induced to a supply voltage of the display driver disposed beneath the glass panel. Therefore, a surge protection unit at a power pad of the display driver that receives the supply voltage is often required for system safety. Similarly, other circuits in the display device may also need surge protection units at the power pads for receiving external voltages. However, the surge protection units increase occupied areas of the circuits, and may complicate manufacturing processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a display controller. The display controller comprises a first chip and a second chip. The first chip controls a display device, and the second chip is externally coupled to the first chip, and configured to be a random access memory. The first chip is further configured to provide a first supply power to the second chip and to access the second chip during the controlling of the display device.

Another aspect of the present disclosure provides a display system. The display system comprises a display device, and a display controller. The display controller is coupled to and configured to control the display device. The display controller comprises a first chip and a second chip. The first chip is configured to control the display device. The second chip is externally coupled to the first chip, and configured to be a random access memory. The first chip is further configured to provide a first supply power to the second chip and to access the second chip during the controlling of the display device.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

The following description of the disclosure accompanies drawings, which are incorporated in and constitute a part of this specification, and which illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
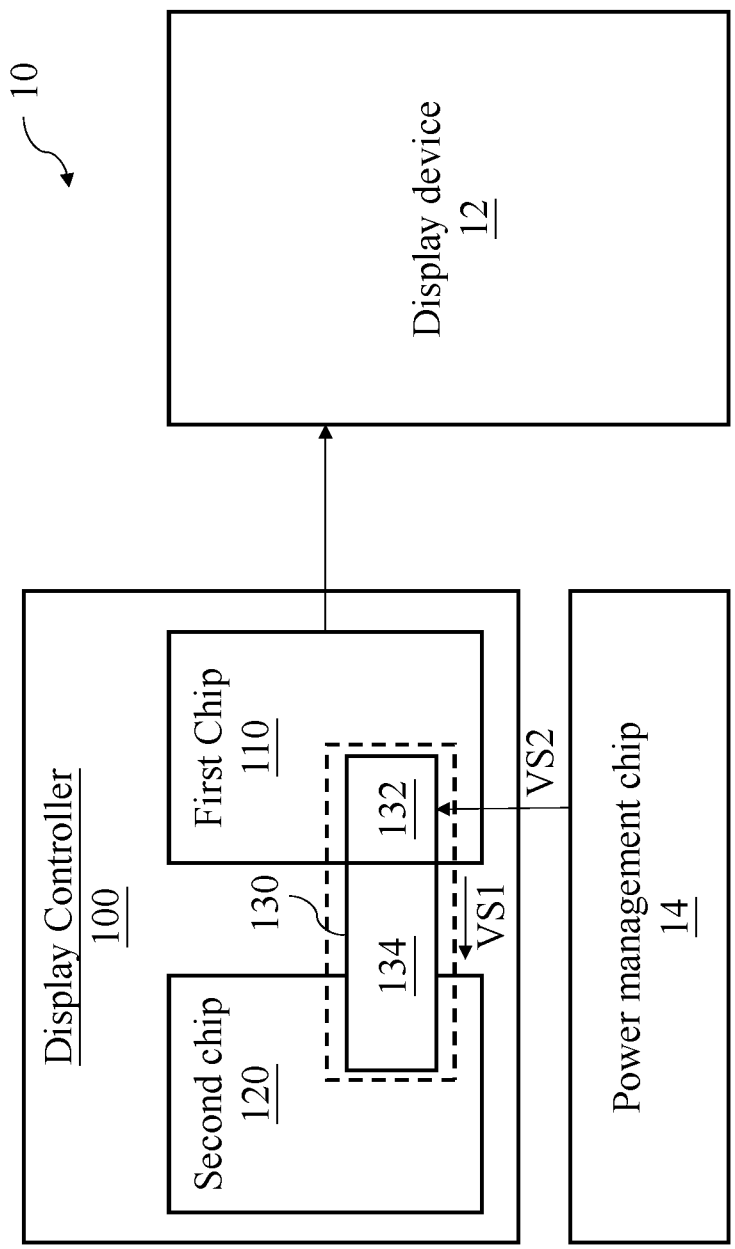
FIG. 1 shows a display system according to one embodiment of the present disclosure.

FIG. 1 shows a display system 10 according to one embodiment of the present disclosure. The display system 10 comprises a display device 12 and a display controller 100. In some embodiments, the display device 12 may be an organic light-emitting diode (OLED) display device. The display controller 100 comprises a first chip 110 and a second chip 120. The first chip 110 may be a controller. The second chip 120 may be externally coupled to the first chip 110, and may be a random access memory that store image data and/or the corresponding information related to the image data to be displayed by the display device 12. That is, the first chip 110 may control the display device 12 and access the second chip 120 during the controlling of the display device 12. In such case, the first chip 110 mainly comprises logic circuits while the second chip 120 mainly comprises memory cells. Therefore, the first chip 110 and the second chip 120 may be manufactured by different suitable processes, thereby improving the yield rates and the quality of the first chip 110 and the second chip 120.

Furthermore, as shown in FIG. 1, the first chip 110 may provide a first supply power VS1 to the second chip 120 according to a second supply power VS2 provided by a power management chip 14 of the display system 10. Since the display system 10 is often disposed right under a display panel of the display device 12, an electrostatic discharge (ESD) event happens externally close to the display panel may induce surges to the second supply power VS2 provided by the power management chip 14. In such case, a surge of the supply power VS1 will also be induced, and an overall energy from the supply powers VS1 and VS2 may be high enough to cause damage to circuits in the first chip 110 and the second chip 120 during the surge events.

To protect components in the first chip 110 and the second chip 120 from being damaged by the surge of the supply powers VS1 and VS2, the display controller 100 is arranged to comprise a protection circuit 130 coupled to the first chip 110 and the second chip 120 for reducing the surge of the first supply power VS1. As shown in FIG. 1, the protection circuit 130 comprises a first portion 132 and a second portion 134. The first portion 132 is configured to be an ESD circuit, and is formed in the first chip 110. Since the ESD circuit is used to provide a discharging path for ESD currents, the ESD circuit may comprise diodes, capacitors, and/or transistors that may endure large currents. Therefore, the ESD circuit often requires a significant circuit area. In the present embodiment, to reduce the overall area of the protection circuit 130, the second portion 134 may be coupled to the first chip 110 and the second chip 120, and may be configured to be a low pass filter, instead of another ESD circuit. In such case, while the first portion 132 provides a discharging path for the ESD current in the first chip 110, the second portion 134 is able to block the surge of the first supply power VS1 from entering the second chip 120.

Figure 2:
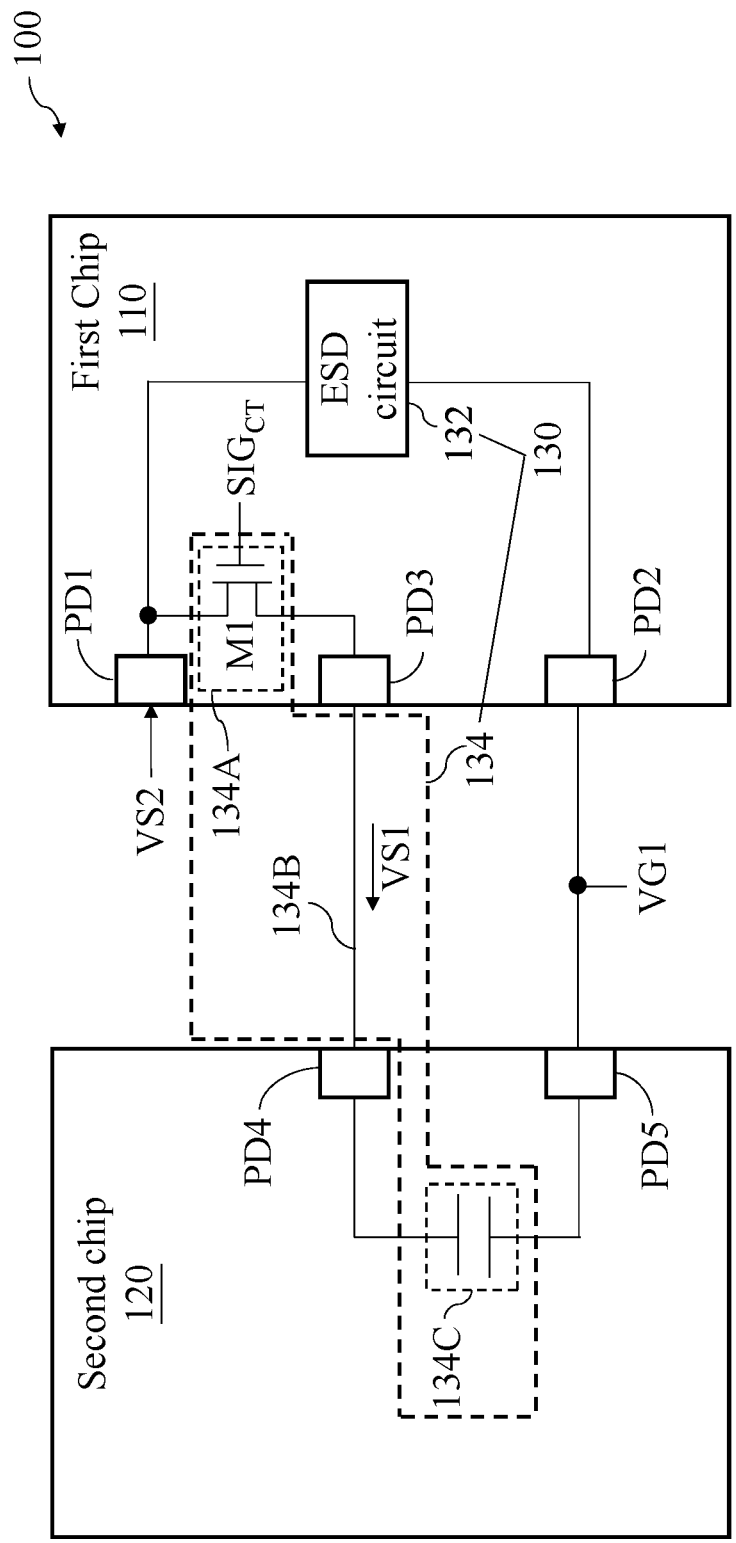
FIG. 2 shows the display controller in FIG. 1.

FIG. 2 shows the voltage controller 100 according to one embodiment of the present disclosure. As shown in FIG. 2, the first chip 110 at least comprises a first pad PD1, a second pad PD2, and a third pad PD3, and the second chip 120 at least comprises a fourth pad PD4 and a fifth pad PD5. The first pad PD1 is arranged to receive the second supply power VS2, and the fourth pad PD4 is arranged to receive the first supply power VS1. Furthermore, the first portion 132 is coupled between the first pad PD1 and the second pad PD2. In the present embodiment, the second pad PD2 is arranged to be coupled to a ground for receiving a ground voltage VG1, and the ESD circuit of the first portion 132 may provide a discharging path between the first pad PD1 and the second pad PD2 so as to prevent the surge of the power supply VS2 from further entering the first chip 110 and damaging circuits of the first chip 110. It is noted that, in addition to the above mentioned pads PD1, PD2, PD3, PD4, and PD5, the first chip 110 as well as the second chip 120 may further comprise a plurality of pads arranged to transmit/receive chip enable signal, data strobe signal, data signals, data mask signal, and/or reference voltage between the first chip 110 and the second chip 120. The detailed description of those pads is omitted here for brevity.

In addition, the second portion 134 is coupled to the first pad PD1, the third pad PD3, the fourth pad PD4, and the fifth pad PD5. The second portion 134 comprises a first circuit 134A, a second circuit 134B and a third circuit 134C. The first circuit 134A is coupled between the first pad PD1 and the third pad PD3, the second circuit 134B is coupled between the third pad PD3 and the fourth pad PD4, and the third circuit 134C is coupled between the fourth pad PD4 and the fifth pad PD5. The first circuit 134A may be formed external to the second chip 120, the second circuit 134B may be formed external to the first chip 110 and the second chip 120, and the third circuit 134C may be formed external to the first chip 110. For example, as shown in FIG. 2, the first circuit 134A is formed in the first chip 110, and the third circuit 134C is formed in the second chip 120.

In the present embodiment, the first circuit 134A is a resistive circuit, the second circuit 134B is an inductive circuit, and the third circuit 134C is a capacitive circuit. As a result, the resistive circuit, the capacitive circuit, and the inductive circuit of the second portion 134 may form a low pass filter on a path from the first pad PD1 through the third pad PD3 and the fourth pad PD4 to the fifth pad PD5.

Since a surge only lasts for a very short time and may be seen as a high-frequency signal, the surge of the supply power VS1 may be filtered by the low pass filter of the second portion 134. Consequently, the surge of the supply power VS1 may not enter the second chip 120 through the fourth pad PD4, and the second chip 120 may be protected without using ESD circuits, thereby reducing the circuit area required by the protection circuit 130.

As shown in FIG. 2, the first circuit 134A may comprise at least one metal-oxide-semiconductor (MOS) transistor M1 to form the resistive circuit. The MOS transistor M1 is a resistive circuit because it can provide a turned-on resistance when being turned on. Furthermore, in the present embodiment, the MOS transistor M1 may also be used as a switch, and the first chip 110 may control (e.g. enable or disable) the second chip 120 by generating a control signal $SIG_{CT}$ for controlling the MOS transistor M1. For example, when the first chip 110 turns on the MOS transistor M1, the first supply power VS1 may be transmitted from the first pad PD1 through the MOS transistor M1 and the third pad PD3 to the fourth pad PD4, so the second chip 120 may be enabled accordingly. Also, when the first chip 110 turns off the MOS transistor M1, the first supply power VS1 may not be transmitted to the fourth pad PD4 of the second chip 120, so the second chip 120 may be disabled accordingly. Although the resistive circuit of the first circuit 134A may be formed by the MOS transistor M1 as shown in FIG. 2, the present disclosure is not limited thereto. In some other embodiments, the resistive circuit of the first circuit 134A may be formed by a resistor or any other suitable resistive component according to the needs.

Furthermore, the capacitive circuit of the third circuit 134C may be formed by at least one MOS transistor, a parallel plate capacitor, or a capacitor of any other suitable type. In the present embodiment, the second chip 120 may be a dynamic random access memory (DRAM). In such case, since the DRAM cells require a plurality of capacitors for storing data, the DRAM is often manufactured by processes that are suitable for forming capacitors. Therefore, in the present embodiment, the capacitive circuit of the third circuit 134C may be formed in the second chip 120 by the same manufacturing process as that used to form the DRAM cells of the second chip 120. However, the present disclosure is not limited thereto. In some other embodiments, the capacitive circuit of the third circuit 134C may also be formed outside of the first chip 110 and the second chip 120 according to design requirements. Furthermore, the second chip 120 may be a static random access memory (SRAM) in some embodiments.

In addition, since metal traces used for chip connection are inductive, in some embodiments, the second circuit 134B may be formed by a metal trace that connects the third pad PD3 of the first chip 110 and the fourth pad PD4 of the second chip 120, thereby simplifying the hardware components required by the protection circuit 130.

Figure 3:
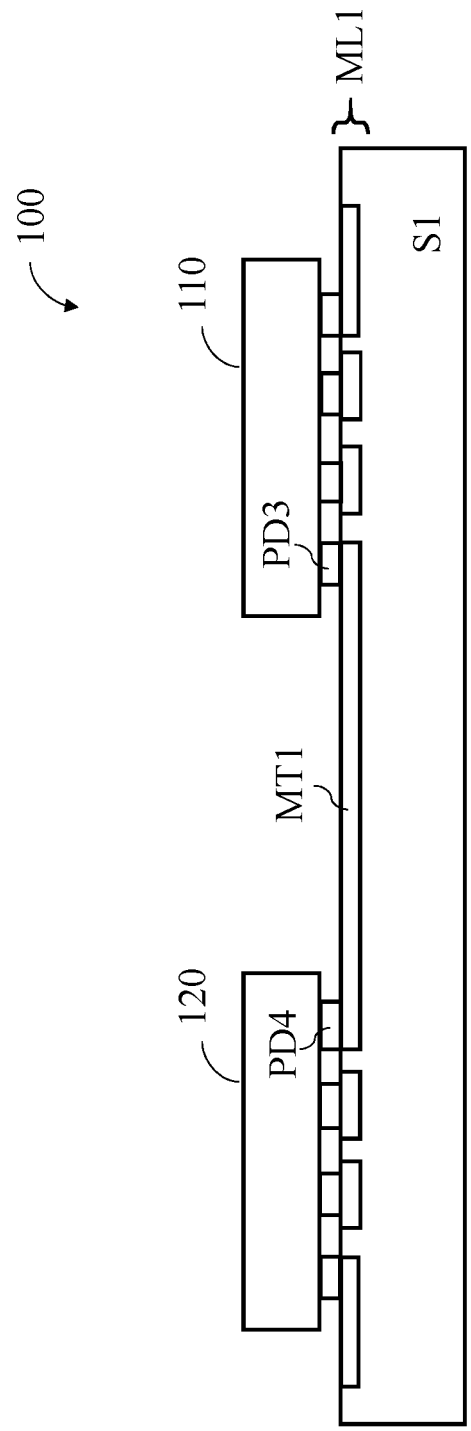
FIG. 3 shows a sectional view of the display controller in FIG. 2.

FIG. 3 shows a sectional view of the display controller 100 according to one embodiment of the present disclosure. As shown in FIG. 3, the display controller 100 further comprises a substrate S1, which may be a semiconductor substrate; the first chip 110 and the second chip 120 are disposed on the substrate S1. In addition, the display controller 100 further comprises a conductive layer ML1 formed on the substrate S1. In such case, the second circuit 134B may be formed by a metal trace MT1 of the conductive layer ML1 that connects the third pad PD3 of the first chip 110 and the fourth pad PD4 of the second chip 120. Furthermore, in some embodiments, the metal trace MT1 may have a special routing pattern to increase the inductance provided by the metal trace MT1. That is, instead of using an inductor, such as a choke, the second circuit 134B may be formed by a metal trace; therefore, the area of the protection circuit 130 may be significantly reduced.

Figure 4:
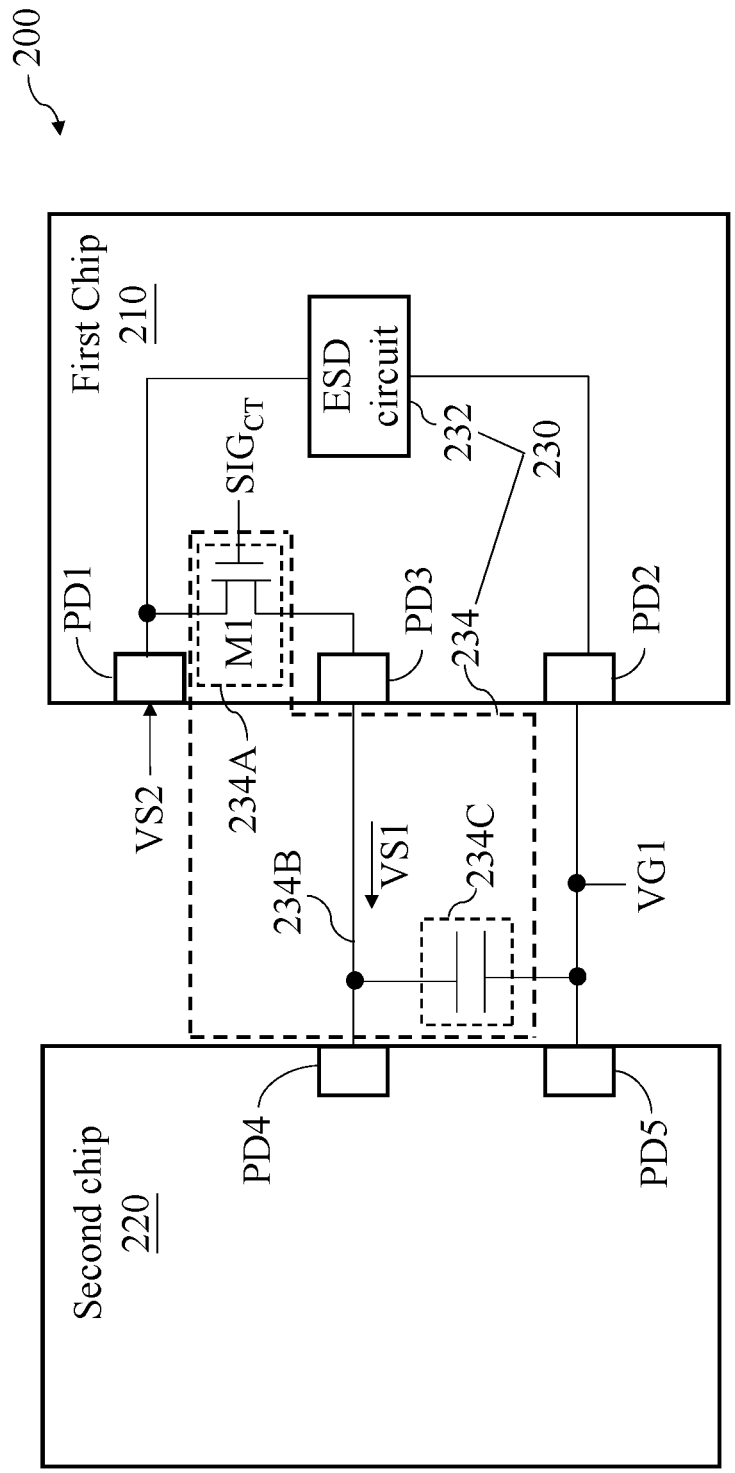
FIG. 4 shows a display controller according to another embodiment of the present disclosure.

FIG. 4 shows a display controller 200 according to another embodiment of the present disclosure. The display controller 200 and the display controller 100 have similar structures and may be operated with similar principles. In some embodiments, the display controller 200 may be adopted to replace the display controller 100 in the display system 10 shown in FIG. 1.

As shown in FIG. 4, the protection circuit 230 comprises a first portion 232 and a second portion 234, and the second portion 234 comprises circuits 234A, 234B, and 234C. The third circuit 234C of the second portion 234 is external to the first chip 210 and the second chip 220. That is, the third circuit 234C may be formed by an external capacitor outside of the first chip 210 and the second chip 220. In some embodiments, the first chip 210, the second chip 220, and the third circuit 234C may be placed on a same circuit board, and may be connected correspondingly by conductive traces formed in the circuit board.

Figure 5:
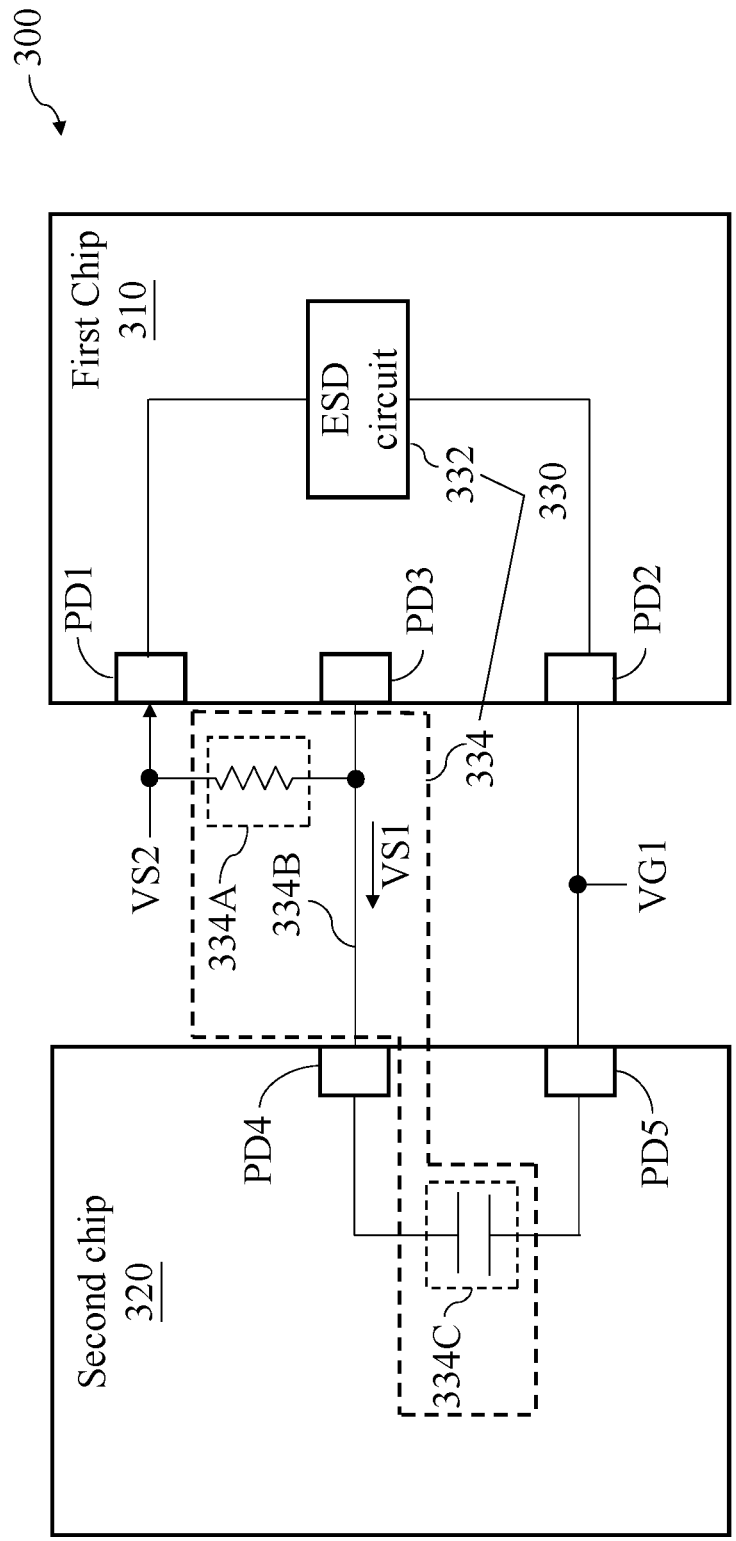
FIG. 5 shows a display controller according to another embodiment of the present disclosure.

FIG. 5 shows a display controller 300 according to another embodiment of the present disclosure. The display controller 300 and the display controller 100 have similar structures and may be operated with similar principles. In some embodiments, the display controller 300 may be adopted to replace the display controller 100 in the display system 10 shown in FIG. 1.

As shown in FIG. 5, the protection circuit 330 comprises a first portion 332 and a second portion 334, and the second portion 334 comprises circuits 334A, 334B, and 334C. The first circuit 334A is external to the first chip 310 and the second chip 320. Furthermore, in the preset embodiment, the first circuit 334A may be formed by an external resistor outside of the first chip 310 and the second chip 320. In some embodiments, the first chip 310, the second chip 320, and the third circuit 334C may be placed on a same circuit board, and may be connected accordingly by conductive traces formed in the circuit board.

In addition, in some embodiments, the first circuit 334A may be directly coupled to the second circuit 334B outside of the first chip 310 and the second chip 320, and the first chip 330 may omit the third pad PD3, thereby further simplifying the design of the first chip 310 and the protection circuit 330. Moreover, in some embodiments, if the metal trace of the second circuit 334B is able to provide the required resistance, the protection circuit 330 may further omit the first circuit 334A.

In summary, the display controllers and the display systems provided by the embodiments of the present disclosure may share the same surge protection unit by using a low pass filter. Therefore, the area of the chips may be reduced and the design of the chips may be simplified, thereby allowing the memory chip of the display controller to have higher cell density and better yield rate.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A display controller comprising:
a first chip, configured to control a display device;
a second chip, externally coupled to the first chip, and configured to be a random access memory; and
a protection circuit, comprising a first portion and a second portion, and the second portion comprising a first circuit, a second circuit, and a third circuit;
wherein the first chip is further configured to provide a first supply power to the second chip according to a second supply power received externally and to access the second chip during the controlling of the display device;
wherein the protection circuit is configured to reduce an effect of a sur e of the second supply power on the first supply power, the first portion is configured to be an electrostatic discharge (ESD) circuit and formed in the first chip, and the second portion is configured to be a low pass filter and coupled to the first chip and the second chip; and
wherein the first chip at least comprises a first pad, a second pad, and a third pad, the second chip at least comprises a fourth pad and a fifth pad, the first pad is arranged to receive the second supply power, the fourth pad is arranged to receive the first supply power, the first portion is coupled between the first pad and the second pad, the first circuit is coupled between the first pad and the third pad, the second circuit is coupled between the third pad and the fourth pad, and the third circuit is coupled between the fourth pad and the fifth pad.

2. The display controller of claim 1, wherein the first circuit is formed external to the second chip, the second circuit is formed external to the first chip and the second chip, and the third circuit is formed external to the first chip.

3. The display controller of claim 1, wherein the first circuit, is formed in the first chip.

4. The display controller of claim 1, wherein the first circuit is formed external to the first chip and the second chip.

5. The display controller of claim 1, wherein the third circuit is formed in the second chip.

6. The display controller of claim 1, wherein the third circuit is formed external to the first chip and the second chip.

7. The display controller of claim 1, wherein the first circuit is a resistive circuit, the third circuit is a capacitive circuit, and the second circuit is an inductive circuit.

8. The display controller of claim 7, wherein the second circuit is a metal trace connecting the third pad and the fourth pad.

9. The display controller of claim 8, further comprising:
a substrate, wherein the first chip and the second chip are disposed on the substrate;
wherein the metal trace is formed on the substrate for connecting the third pad and the fourth pad.

10. The display controller of claim 7, wherein the resistive circuit is formed by at least one metal-oxide-semiconductor transistor.

11. The display controller of claim 10, wherein the first, chip is further configured to turn on the metal-oxide-semiconductor transistor to enable the second chip, and turn off the metal-oxide-semiconductor transistor to disable the second chip.

12. The display controller of claim 7, wherein the capacitive circuit is formed by at least one metal-oxide-semiconductor transistor.

13. The display controller of claim 1, wherein the second chip is a dynamic random access memory (DRAM) or a static random access memory (SRAM).

14. A display system, comprising:
a display device; and
a display controller, coupled to and configured to control the display device, and the display controller comprising:
a first chip, configured to control the display device; and
a second chip, externally coupled to the first chip, and configured to be a random access memory; and
a protection circuit, comprising a first portion and a second portion;
wherein the first chip is further configured to provide a first supply power to the second chip according to a second supply power received externally and to access the second chip during the controlling of the display device;
wherein the protection circuit is configured to reduce an effect caused by a surge of the second supply power on the first supply power, the first portion is configured to be an electrostatic discharge (ESD) circuit and formed in the first chip, and the second portion is configured to be a low pass filter and coupled to the first chip and the second chip; and
wherein the first chip at least comprises a first pad, a second pad, and a third pad, the second chip at least, comprises a fourth pad and a fifth pad, the first pad is arranged to receive the second supply power, the fourth pad is arranged to receive the first supply power, the first portion is coupled between the first pad and the second pad, and the second portion is coupled to the first pad, the third pad, the fourth pad, and the fifth pad.

15. The display system of claim 14, wherein the display device is an organic light-emitting diode (OLED) display device.

16. The display system of claim 14, further comprising:
a power management chip, configured to provide the second supply power to the first chip;
wherein the first chip is configured to provide the first supply power to the second chip according to the second supply power.

* * * * *